US006233306B1

(12) United States Patent
Van Sprang

(10) Patent No.: US 6,233,306 B1
(45) Date of Patent: May 15, 2001

(54) X-RAY IRRADIATION APPARATUS INCLUDING AN X-RAY SOURCE PROVIDED WITH A CAPILLARY OPTICAL SYSTEM

(75) Inventor: Hendrik A. Van Sprang, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/414,461

(22) Filed: Oct. 7, 1999

(30) Foreign Application Priority Data

Oct. 21, 1998 (EP) .................................................. 98203546

(51) Int. Cl.$^7$ ...................................................... G21K 1/06
(52) U.S. Cl. ............................................. 378/35; 378/145
(58) Field of Search ................................. 378/84, 85, 145

(56) References Cited

U.S. PATENT DOCUMENTS 5,192,869 * 3/1993 Kumakhoo .............................. 378/84

FOREIGN PATENT DOCUMENTS

3927132A1    2/1991 (DE).
0244504B1   10/1993 (EP).

OTHER PUBLICATIONS

Proceedings of SPIE, vol. 3115 (1997), "Polycapillary Focusing Optic for Low–Energy–X–Ray Fluorescence", by Ira Klotzko et al.

* cited by examiner

Primary Examiner—Craig E. Church

(57) ABSTRACT

Generally known conventional X-ray tubes include a window opening which is covered by an X-ray transparent X-ray window which is usually made of beryllium. A significant absorption of X-rays of comparatively long wavelength, for example of the order of magnitude of from 1 nm to 10 nm, occurs in such windows. According to the invention, a bundle of X-ray conducting capillary tubes (46) is connected to the window opening of the X-ray tube, the other end (48) of the bundle being provided with a very thin X-ray window (50) which seals the interior of the capillary tubes (46), being in vacuum contact with the vacuum space of the X-ray tube, from the environment in a vacuum tight manner.

8 Claims, 4 Drawing Sheets

X-RAY IRRADIATION APPARATUS INCLUDING AN X-RAY SOURCE PROVIDED WITH A CAPILLARY OPTICAL SYSTEM

The invention relates to an apparatus for irradiating an object by means of X-rays, including an X-ray source for producing X-rays for irradiating the object, which X-ray source is provided with a bundle of capillary tubes which conduct X-rays, the end of the bundle which is intended as an exit for the X-rays being provided with an X-ray transparent X-ray window.

An apparatus of this kind is known from European patent No. 0 244 504 B 1.

X-ray irradiation apparatus can be used in a large number of fields of application. A first example of such an application is X-ray analysis where the composition and/or the structure of materials is analyzed. The object to be irradiated is then formed by a specimen of the material to be analyzed by means of the apparatus. Generally speaking, two analysis techniques are feasible: X-ray fluorescence and X-ray diffraction. In the case of X-ray fluorescence, a specimen is irradiated by means of a polychromatic X-ray beam. The irradiation excites the various elements present in the specimen which then emit X-rays (fluorescent radiation) which is characteristic of the constituent elements. The elementary composition of the specimen can be determined by detection and analysis of this fluorescent radiation. In the case of X-ray diffraction, the specimen is generally irradiated by means of a monochromatic X-ray beam which is deflected (diffracted) only at given angles because of the regularity of the crystal structure of the components present in the specimen. The diffraction angles then offer information as regards the crystal structure of the constituents of the specimen.

Another example of a field of application of X-ray irradiation apparatus is X-ray lithography where very small structures for microelectronics are formed on a substrate or masks are manufactured for the exposure of such structures. The object to be irradiated is then formed by said substrate or the mask to be manufactured. Another example of a field of application for X-ray irradiation apparatus is medical therapy or diagnostics where it is often important to apply X-rays to a very accurately defined region of the human body. The object to be irradiated is then formed by the tissue to be irradiated.

In all of said applications the X-rays required for irradiating the object to be examined or treated can be generated by means of an X-ray tube. In such an X-ray tube the X-rays are generated by electron bombardment of an anode so that X-rays are produced in the anode. Because this process must take place in vacuum, the X-ray tube is necessarily constructed so as to include a vacuum tight housing. In order to conduct the X-rays out of the X-ray tube, the housing is provided with a window opening which is situated near the anode and serves to conduct the X-rays produced out of the tube. In generally known conventional X-ray tubes this window opening is covered by an X-ray transparent X-ray window which is usually made of beryllium.

Even though the choice of beryllium as the window material is based on the attractive properties of beryllium in respect of the absorption of X-rays, such absorption cannot be ignored. This holds notably in the case of X-rays having a comparatively long wavelength, for example of the order of magnitude of from 1 nm to 10 nm. It could be attempted to reduce the absorption by the window by making the window thinner, but the strength of the material imposes a limit in this respect. The thickness that can nowadays be achieved for beryllium X-ray windows is of the order of magnitude of 50 $\mu$m. In order to withstand the pressure of the ambient atmosphere on the X-ray window, such thin windows are supported by a supporting grid. Because of the lack of solidity and the high brittleness of beryllium, it is not very likely that these windows can be constructed to be much thinner yet. Other materials for X-ray windows, for example foils of a synthetic material, cannot be used because of the comparatively high temperature whereto the window is exposed during operation of the X-ray tube.

In the apparatus described in the cited European patent No. 0 244 504 capillary tubes for total reflection of X-rays on the interior thereof are combined so as to form a bundle having a length of approximately from 0.5 mm to 1.0 mm. The capillary tubes in this bundle have a diameter of from approximately 10 $\mu$m to 20 $\mu$m, the bundle comprising as many as one hundred thousand capillary tubes so that it has a plate-like external appearance. This plate-like bundle is provided on one side with a thin layer of, for example aluminium or magnesium of a thickness of the order of magnitude of 5 $\mu$m. This thin layer is bombarded by a thin electron beam so that it serves as an X-ray target, the energy of the electron beam being of the order of magnitude of 20 keV. The diameter of the electron beam is approximately 5 $\mu$m, so that it is smaller than the diameter of each of the capillary tubes in the bundle. The other side of the plate-like bundle is provided with a thin layer of, for example beryllium, carbon or a higher polymer with an aluminum coating having a thickness of the order of magnitude of 2 $\mu$m in order to transmit the X-rays generated in the former layer and to intercept any electrons. The latter layer bears on the grid which is formed by the ends of the capillary tubes in the bundle.

Granted, this known structure is suitable for generating X-rays having a comparatively long wavelength. However, generating X-rays of comparatively long wavelength is a process with a low efficiency, i.e. a comparatively high power of the generating electron beam is required so as to generate a low X-ray intensity. Because the thin layer acting as the X-ray target is not provided with cooling means for discharging the heat dissipated in this layer, only a small electric power can be applied to this layer by the electron beam. The X-ray power of this structure, therefore, is very limited.

It is an object of the invention to provide an X-ray irradiation apparatus in which the X-ray source is suitable to produce X-rays of comparatively long wavelength and an intensity which suffices to operate the X-ray irradiation apparatus in practical circumstances. To this end, the apparatus according to the invention is characterized in that the X-ray source includes an X-ray tube having a vacuum tight housing which is provided with a window opening for conducting the X-rays produced by the tube to the exterior of the housing, that one end of the bundle is provided on the window opening in a vacuum tight manner and that the capillary tubes at that end of the bundle are directed towards the location where the X-rays are generated, that the interior of the capillary tubes is in vacuum contact with the vacuum space of the X-ray tube which is situated within the housing, and that the X-ray transparent X-ray window seals the interior of the capillary tubes from the environment in a vacuum tight manner.

A bundle of X-ray conducting capillary tubes is known per se, for example from a contribution to the Proceedings of SPIE, Vol. 3115 (1997), entitled "Polycapillary Focusing Optic For Low-Energy-X-Ray Fluorescence" by Ira Klotzky and Qi-Fan Xiao. The conductive properties of such capillary tubes is based on the well-known phenomenon concerning total reflection of X-rays on the interior of the capillary tubes. Because of the total reflection, only an insignificant loss of intensity occurs, so that these capillary tubes can be used to conduct the X-rays in a loss-free manner. The capillary tubes are assembled so as to form a bundle in known manner in that at one end (the end to be connected to the X-ray tube) of this bundle the capillary tubes are enclosed by a bonding material, for example a synthetic material. Thus, the gaps between the capillary tubes are filled in an airtight manner and at the same time an envelope is formed on the outer side of the bundle; this envelope can also be used for connecting the bundle to the X-ray tube. Such connection can be realized, for example by providing the window opening of the tube with a tubular raised edge in which said envelope can be fitted in a vacuum tight manner.

Long-wave X-rays are strongly absorbed by gases, notably air. Therefore, the interior of the capillary tubes is in vacuum contact with the interior of the X-ray tube which is situated within the housing, so that any gas present in said capillary tubes cannot absorb the long-wave X-rays.

The end of the bundle which faces the anode of the X-ray tube can then be shaped in such a manner that maximum X-ray power is taken up by the bundle. For example, in the case of a more or less point-shaped X-ray focus (a focal spot of comparatively small dimensions in practical circumstances) all capillary tubes of the bundle can be directed towards said focus. The other end of the bundle may have an appearance adapted to the intended application of the X-ray analysis apparatus; for example, the capillary tubes at that end can all be directed towards one point again, so that the total power conducted by the bundle is concentrated onto said one point, or an X-ray focal line of a desired shape can be formed.

Because of the small cross-section of the capillary tubes, the ends thereof at the exit side of the bundle constitute a surface which may serve as a fine-meshed supporting grid for the X-ray window, so that the thickness of the X-ray window may be much smaller than that of the X-ray window in customary X-ray tubes.

The thickness of the X-ray window amounts to less than one micrometer in one embodiment of the invention. When a bundle serving as a fine-meshed supporting grid consists of capillary tubes of a diameter which is customary for such X-ray optical fibers (i.e. of the order of magnitude of from 10 $\mu$m to 100 $\mu$m), this thickness of the X-ray window can be realized without special effort.

The X-ray window in another embodiment of the invention is made of a synthetic foil. For this synthetic foil use could be made of polypropylene or polyethylene naphtalate (PEN). These materials are synthetic materials containing practically exclusively elements having a low atomic number (carbon and hydrogen) so that the material of these windows absorbs only a comparatively small amount of long-wave X-rays. When said material is not commercially available as a foil of the desired thickness, it should be subjected to a treatment aimed at realizing such a small thickness prior to the manufacture of the window. This can be achieved by stretching the available foil. Said PEN, however, can be purchased in the desired thickness. A polymer X-ray window of small thickness is also marketed by MOXTEK and bears the product identification AP1.3; these windows have a polymer thickness of 300 nm, so that they can also be used for the above purpose.

The X-ray window of another embodiment yet of the invention is made of diamond. Like the above-mentioned synthetic materials, diamond, consisting exclusively of carbon, has a comparatively low absorptivity for long-wave X-rays. Moreover, diamond is chemically very resistant; this may be of advantage for a variety of applications. The manufacture of diamond layers of small thickness is known per se, for example from the published German patent application ("Offenlegungsschrift") No. 39 27 132 A1.

The invention will be described in detail hereinafter with reference to the Figures in which corresponding elements are denoted by corresponding reference numerals. Therein:

Figure 4:
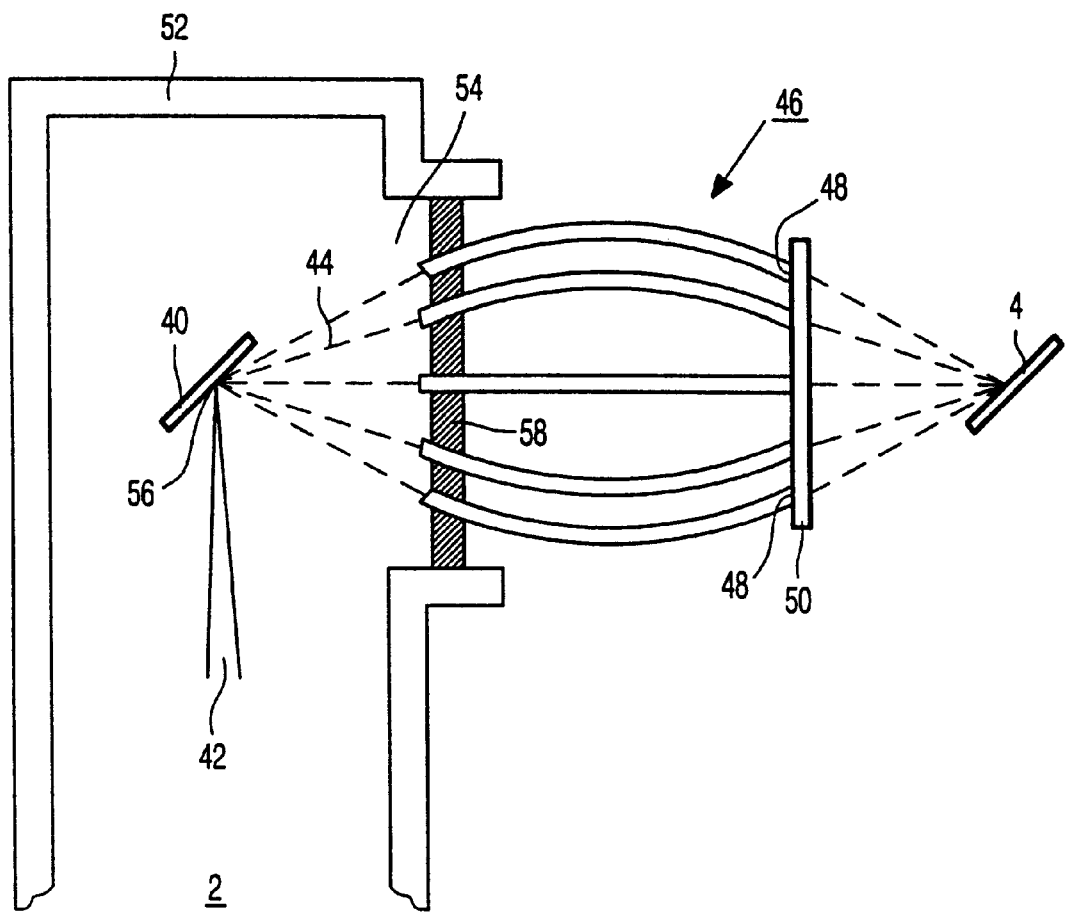

FIG. 4 a diagrammatic representation of an X-ray source according to the invention.

Figure 1:
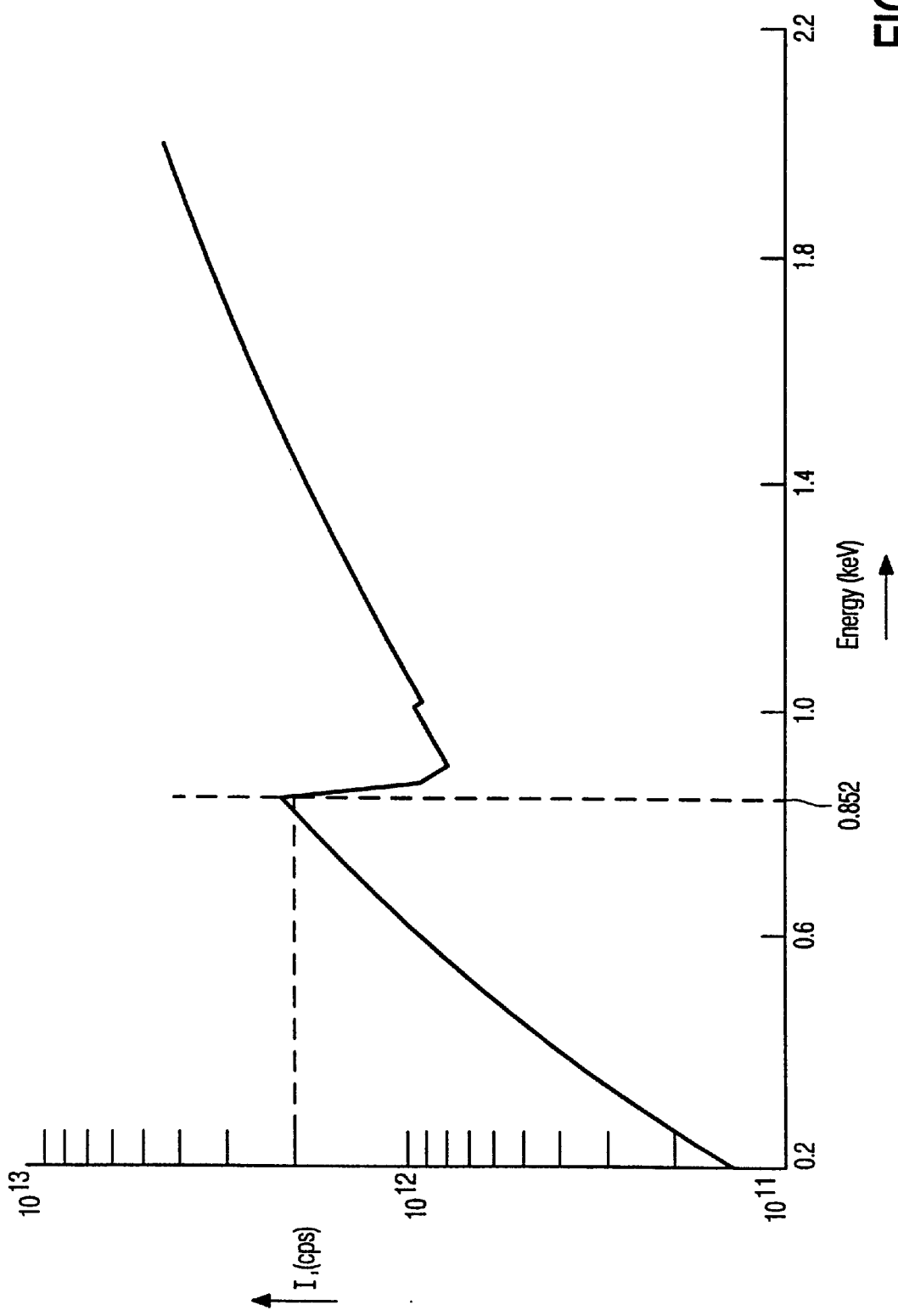
FIG. 1 is a graphic representation of the intensity of the X-rays as generated by a known X-ray tube, illustrating the problem imposed by the X-ray absorption.

FIG. 1 is a graphic representation of the intensity of the X-rays as generated by a known X-ray tube, illustrating the problem imposed by the X-ray absorption by a beryllium X-ray window. This graph has been obtained by theoretically calculating the intensity of X-rays as a function of the wavelength thereof (expressed in the reciprocal unit keV) as emitted by a nickel anode irradiated by an electron beam with an energy of 50 keV and a beam current of 60 mA. The intensity of this radiation is represented in an arbitrary measure; in this case it is expressed as a number of counting pulses per second (cps) of an arbitrary detector. This graph shows that at a relevant wavelength of the L$\alpha$ line of nickel of 146 nm (corresponding to an energy of 0.852 keV), an intensity of approximately $2 \times 10^{12}$ cps is reached.

Figure 2:
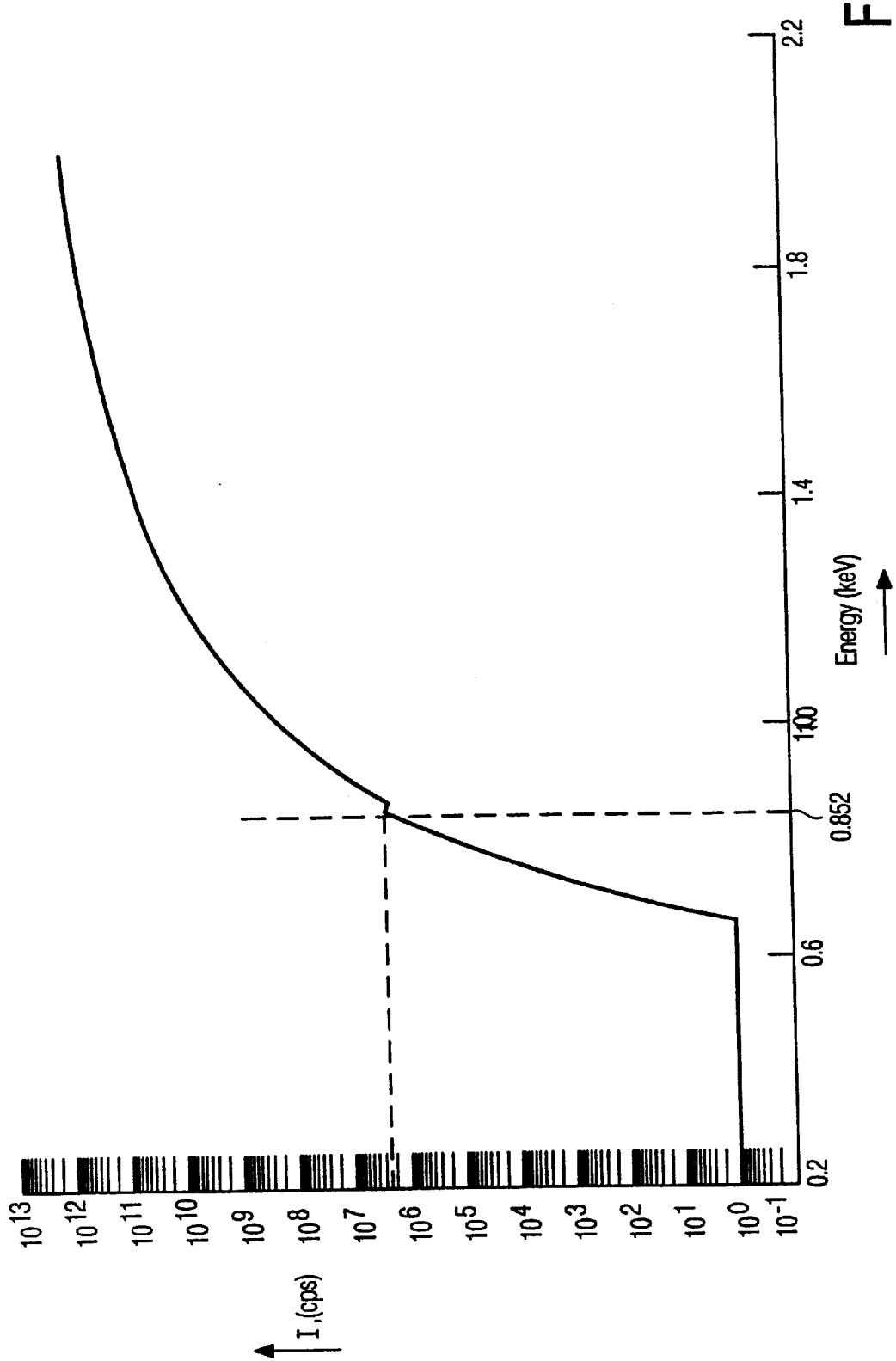
FIG. 2 is a graphic representation of the absorption of the X-rays in a beryllium window of a known X-ray tube, illustrating the problem imposed by the X-ray absorption.

FIG. 2 is a graphic representation of the absorption of the X-rays in a beryllium window of a known X-ray tube, illustrating the problem imposed by the X-ray absorption. For this Figure it is assumed that the X-rays must pass a beryllium window having a thickness of 100 $\mu$m. The radiation is incident on this window as shown in FIG. 1. This graph shows that an intensity of approximately $2 \times 10^6$ cps is reached for the above-mentioned wavelength of the L$\alpha$ line of nickel of 1.46 nm (corresponding to an energy of 0.852 keV), thus implying an attenuation by a factor $10^6$. This attenuation is thus due to the presence of the 100 $\mu$m beryllium window in the path of the X-rays.

Figure 3:
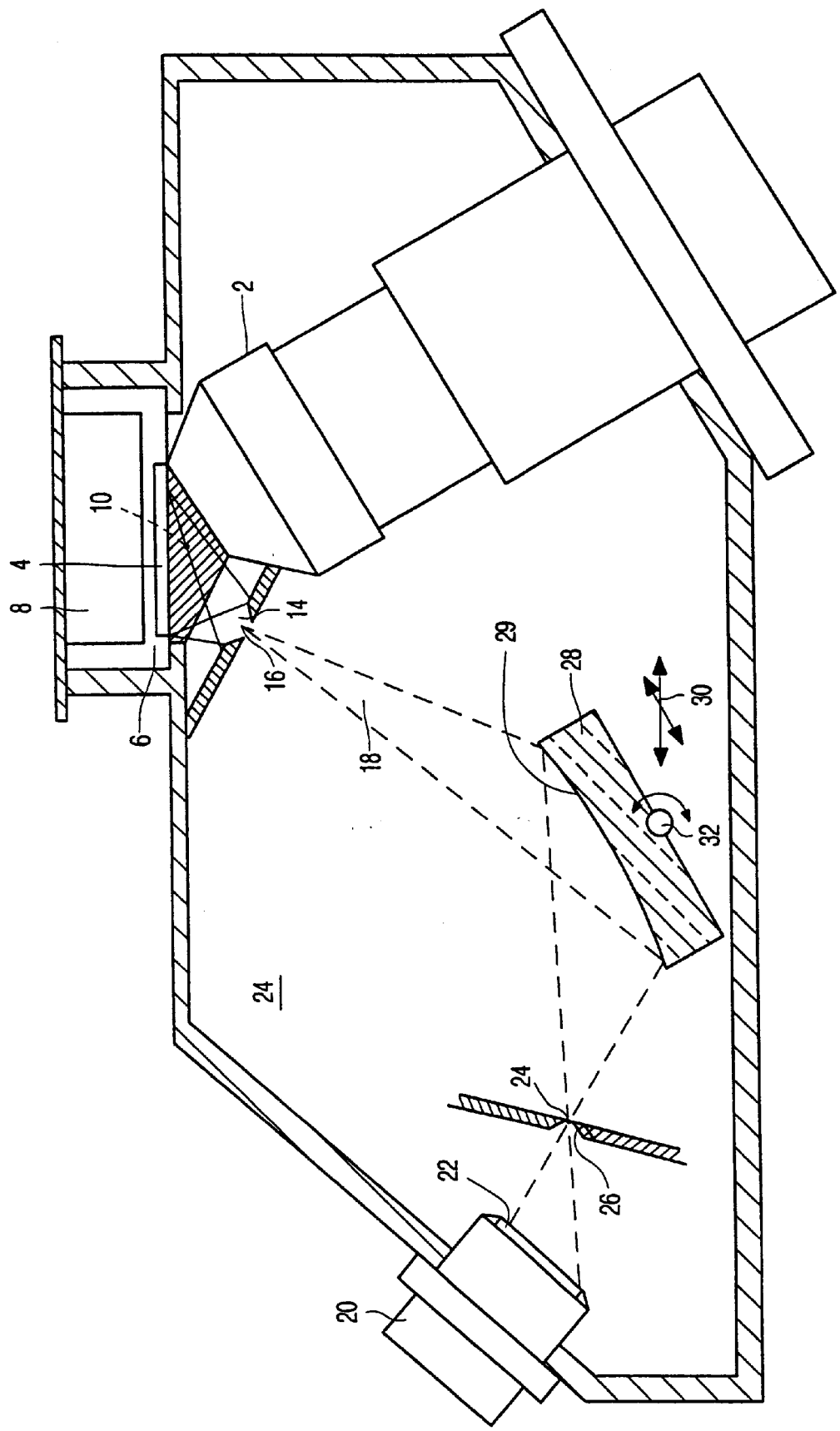
FIG. 3 is a diagrammatic representation of an X-ray analysis apparatus in which the X-ray source according to the invention can be used.

FIG. 3 shows a part of a known X-ray analysis apparatus which is of relevance to the invention and in which the X-ray source according to the invention can be used, the apparatus in this case being an X-ray spectrometer. The X-ray spectrometer includes an X-ray tube 2 for generating a beam of X-rays 10. The beam 10 irradiates a specimen 4 of a material to be examined by means of the X-ray spectrometer; the specimen is arranged in a specimen location for accommodating the specimen.

The specimen 4 is arranged in a specimen holder 6 in a separate specimen space 8. X-ray fluorescent radiation which propagates in all directions is generated in the specimen as denoted by solid lines in the Figure. The fluorescent radiation irradiates an entrance slit 14 so that this entrance slit performs the function of the object 16 to be imaged for the imaging Rowland geometry to be described with reference to FIG. 2. In the Figure the width of the slit 14 is not shown to scale for the sake of clarity; in practical circumstances the width of this slit is of the order of from some tens of microns to some millimeters, depending on the relevant application. After having left the entrance slit 14, the beam of fluorescent radiation 18 is incident on an analysis crystal 28 which has a curved reflecting surface 29. The shape of the surface will be described in detail hereinafter with reference to FIG. 3. In this context it is to be noted merely that the surface 29 of the analysis crystal 28 has a cylindrical shape, i.e. the line of intersection of the crystal surface and the plane of drawing is a curved line (i.e. the line 29 in the Figure), but the line of intersection of the crystal surface and a plane perpendicular to the plane of drawing (for example, the plane perpendicular to the plane of drawing and also perpendicular to the line 29) is a straight line. In this arrangement the analysis crystal has a dual function: it selects the desired wavelength, determined by the angle of incidence, from the beam of fluorescent radiation on the basis of said Bragg relation (2d.sin'=n$\lambda$), and it focuses the beam emanating from the apparent object point 16 in the image point 24. This image point is imaged on an exit slit 26 which constitutes the entrance collimator for an X-ray detector 20. Via an entrance window 22, the X-rays thus deflected are incident on the detector 20 in which they are detected, after which further signal processing is performed by means of electronic means (not shown).

The analysis crystal 28 is mounted on a holder which is not shown in the Figure and is displaceable in two directions in the plane of drawing (as denoted by the arrows 30) and also rotatable about an axis 32 perpendicular to the plane of drawing. By virtue of these possibilities for displacement, the analysis crystal can be adjusted in an accurately defined orientation and position.

The beam path from the X-ray tube 2 to the detector 20 extends through a hermetically sealable measuring space 24 which, in the case of X-rays of long wavelength, can be evacuated, if desired, or be filled with a gas which is suitable for such measurements.

The known X-ray analysis apparatus utilizes a known X-ray tube which is provided with an exit window for the X-rays 10. When the invention is used, the X-ray window can be omitted because the function of this element is performed by the bundle of X-ray conducting capillary tubes, with the X-ray window provided thereon, which forms part of the X-ray source according to the invention.

FIG. 4 is a diagrammatic representation of an X-ray source according to the invention. The X-ray source consists of an X-ray tube 7 in which an anode 40 is provided. The anode is irradiated by an electron beam 42 which forms a focal spot 56 on the anode so that X-rays 44 are generated in the anode in known manner; the X-rays can leave the X-ray tube 7 via a window opening 54. The X-ray source according to the invention is also provided with a bundle of capillary tubes 46 which conduct X-rays and one end of which is connected to the window opening 54 in a vacuum tight manner. The capillary tubes at that end of the bundle are directed towards the location 56 on the anode where the X-rays are generated. Even though FIG. 4 shows the bundle of capillary tubes as a bundle with gaps between the capillary tubes, a variety of constructions of this bundle is feasible. It is notably possible to construct an embodiment in which the capillary tubes are arranged against one another and are rigidly interconnected. The desired vacuumtightness of the bundle, required so as to enable vacuumtight connection of the bundle to the window opening 54 of the X-ray tube, can then be achieved by providing the exterior of the bundle with a layer of a synthetic material which is also connected to the inner side of the window opening 54. In FIG. 4 the vacuum sealing is diagrammatically represented by a plate-shaped support 58 in which the capillary tubes are provided in a vacuumtight manner. This plate-shaped support itself is mounted in the window opening 54 in a vacuumtight manner.

An evacuated space is present in the housing 52 of the X-ray tube 7. This space is in vacuum contact with the interior of the capillary tubes, the other end 48 of which is sealed in a vacuumtight manner by means of an X-ray transparent X-ray window 50 which is made of a synthetic material or diamond of a very small thickness. This small thickness is possible because the ends of the capillary tubes of the bundle 46 act as a fine-meshed supporting grid having a periodic structure of, for example 10 $\mu$m, so that a thickness of 1 $\mu$m is feasible without special steps being required. At the end 48 of the bundle 46 the capillary tubes may be oriented in such a manner that the X-rays emanating therefrom are concentrated onto one location again. The specimen 10 to be examined in the apparatus can be arranged in that location.

The X-ray power taken up by the bundle 46 is dependent on the space angle at which the entrance side of the bundle is perceived from the X-ray focus 56, on the transmission of the X-rays by the capillary tubes, and on the extent to which the window 50 transmits the X-rays. These parameters can all be varied within broad limits. In order to make a coarse estimate nevertheless of the improved X-ray yield according to the invention, it will be assumed that said space angle equals 0.2 staradian (corresponding to a receiving surface area of 1 $cm^2$ at a distance of 2 cm from the anode), that said transmission is of the order of magnitude of 10% (see the cited article Proceedings of SPIE, "Polycapillary Focusing . . .", Table 2, paragraph 3.2) and that the X-ray absorption in the X-ray window is negligibly small because of the small thickness and the suitable choice of material. This means that a fraction of approximately 3% (i.e. $0.2/2\pi$) of the total amount of X-rays emitted by the anode in a space angle of $2\pi$ staradians enters the capillary tubes which pass on this fraction with a transmission efficiency of 10%, so that ultimately 0.3% of the radiation generated in the anode comes to the benefit of the irradiation of the specimen. Even if all X-rays generated in the anode in the known X-ray tubes were situated within the space angle used (which is certainly not the case), the intensity at the area of the specimen would still be improved by a factor of approximately 3000 (0.3% of $10^6$) by carrying out the invention.

What is claimed is:

1. An apparatus for irradiating an object (10) by means of X-rays, including an X-ray source (7) for producing X-rays (44) for irradiating the object, which X-ray source is provided with a bundle of capillary tubes (46) which conduct X-rays, the end (48) of the bundle which is intended as an exit for the X-rays being provided with an X-ray transparent X-ray window (50), characterized in that the X-ray source (7) includes an X-ray tube having a vacuumtight housing (52) which is provided with a window opening (54) for conducting the X-rays (44) produced by the tube to the exterior of the housing, one end of the bundle is provided on the window opening (54) in a vacuumtight manner and that the capillary tubes at that end of the bundle are directed towards the location (56) where the X-rays are generated, the interior of the capillary tubes (46) is in vacuum contact with the vacuum space of the X-ray tube which is situated within the housing, and the X-ray transparent X-ray window (50) seals the interior of the capillary tubes from the environment in a vacuumtight manner.

2. An X-ray irradiation apparatus as claimed in claim 1, in which the thickness of the X-ray window (50) amounts to less than one micrometer.

3. An X-ray radiation apparatus as claimed in claim 1, in which the X-ray window (50) is made of a foil of a synthetic material.

4. An X-ray irradiation apparatus as claimed in claim 1, in which the X-ray window (50) is made of diamond.

5. An X-ray irradiation apparatus as claimed in claim 1, which apparatus is an X-ray analysis apparatus.

6. An X-ray irradiation apparatus as claimed in claim 1, which apparatus is an X-ray irradiation apparatus for medical purposes.

7. An X-ray irradiation apparatus as claimed in claim 1, which apparatus is an X-ray lithography apparatus.

8. An X-ray source as defined in claim 1.

* * * * *